United States Patent
Brown et al.

(10) Patent No.: US 7,553,732 B1
(45) Date of Patent: Jun. 30, 2009

(54) INTEGRATION SCHEME FOR CONSTRAINED SEG GROWTH ON POLY DURING RAISED S/D PROCESSING

(75) Inventors: David E. Brown, Pleasant Valley, NY (US); Scott D. Luning, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 579 days.

(21) Appl. No.: 11/150,923

(22) Filed: Jun. 13, 2005

(51) Int. Cl.
*H01L 21/336* (2006.01)

(52) U.S. Cl. .............................. 438/300; 257/E21.619

(58) Field of Classification Search ................. 438/300, 438/303, 429; 257/E21.619
See application file for complete search history.

(56) References Cited

U.S. PATENT DOCUMENTS

| | | | |
|---|---|---|---|
| 4,606,866 A | 8/1986 | McGlothlin et al. | |
| 4,868,617 A | 9/1989 | Chiao et al. | |
| 4,877,757 A | 10/1989 | York et al. | |
| 4,933,295 A | 6/1990 | Feist | |
| 5,091,763 A | 2/1992 | Sanchez | |
| 5,180,464 A | 1/1993 | Tatsumi et al. | |
| 5,183,770 A | 2/1993 | Ayukawa et al. | |
| 5,298,454 A | 3/1994 | D'Asaro et al. | |
| 5,319,232 A | 6/1994 | Pfiester | |
| 5,387,309 A | 2/1995 | Bobel et al. | |
| 5,556,462 A | 9/1996 | Celii et al. | |
| 5,646,073 A | 7/1997 | Grider et al. | |
| 5,670,018 A | 9/1997 | Eckstein et al. | |
| 5,677,214 A | 10/1997 | Hsu | |
| 5,696,012 A | 12/1997 | Son | |
| 5,710,450 A | 1/1998 | Chau et al. | |
| 5,773,328 A | 6/1998 | Blanchard | |
| 5,854,136 A | 12/1998 | Huang et al. | |
| 5,902,125 A | 5/1999 | Wu | |
| 5,926,701 A | 7/1999 | Li | |
| 5,949,126 A | 9/1999 | Dawson et al. | |
| 5,953,609 A | 9/1999 | Koyama et al. | |
| 5,956,590 A | 9/1999 | Hsieh et al. | |
| 6,017,779 A | 1/2000 | Miyasaka | |
| 6,024,794 A | 2/2000 | Tamamura et al. | |
| 6,074,939 A | 6/2000 | Watanabe | |
| 6,077,076 A | 6/2000 | Comfort | |
| 6,124,610 A | 9/2000 | Cheek et al. | |
| 6,133,093 A | 10/2000 | Prinz et al. | |
| 6,143,036 A | 11/2000 | Comfort | |

(Continued)

FOREIGN PATENT DOCUMENTS

JP 06326049 A 11/1994

OTHER PUBLICATIONS

Van Meer et al., "70 nm Fully-Depleted SOI CMOS Using A New Fabrication Scheme: The Spacer/Replacer Scheme," IMEC, Leuven, Belgium.

(Continued)

*Primary Examiner*—W. David Coleman

(57) ABSTRACT

A method for constraining lateral growth of gate caps formed during an epitaxial silicon growth process to achieve raised source/drain regions on poly silicon is presented. The method is appropriate for integration into a manufacturing process for integrated circuit semiconductor devices. The method utilizes selective etch processes, dependant upon the material comprising the protective layer (hard mask) over the gate and the material of the spacers, e.g., oxide mask/nitride spacers, or nitride mask/oxide spacers.

20 Claims, 6 Drawing Sheets

U.S. PATENT DOCUMENTS

| | | | |
|---|---|---|---|
| 6,159,422 A | 12/2000 | Graves et al. | |
| 6,165,826 A | 12/2000 | Chau et al. | |
| 6,165,857 A | 12/2000 | Yeh et al. | |
| 6,165,906 A | 12/2000 | Bandyopadhyay et al. | |
| 6,187,645 B1 | 2/2001 | Lin et al. | |
| 6,190,981 B1 | 2/2001 | Lin et al. | |
| 6,214,049 B1 | 4/2001 | Gayer et al. | |
| 6,228,730 B1 | 5/2001 | Chen et al. | |
| 6,228,746 B1 | 5/2001 | Ibok | |
| 6,235,568 B1 | 5/2001 | Murthy et al. | |
| 6,245,684 B1 | 6/2001 | Zhao et al. | |
| 6,251,764 B1 | 6/2001 | Pradeep et al. | |
| 6,255,152 B1 | 7/2001 | Chen | |
| 6,271,572 B1 | 8/2001 | Fujita | |
| 6,277,700 B1 | 8/2001 | Yu et al. | |
| 6,277,736 B1 | 8/2001 | Chen et al. | |
| 6,284,662 B1 | 9/2001 | Mikagi | |
| 6,294,432 B1 | 9/2001 | Lin et al. | |
| 6,303,447 B1 | 10/2001 | Chhagan et al. | |
| 6,313,017 B1 | 11/2001 | Varhue | |
| 6,316,302 B1 | 11/2001 | Cheek et al. | |
| 6,335,251 B2 | 1/2002 | Miyano et al. | |
| 6,346,447 B1 | 2/2002 | Rodder | |
| 6,346,468 B1 | 2/2002 | Pradeep et al. | |
| 6,346,505 B1 | 2/2002 | Morita et al. | |
| 6,348,387 B1 | 2/2002 | Yu | |
| 6,380,043 B1 | 4/2002 | Yu | |
| 6,383,877 B1 | 5/2002 | Ahn et al. | |
| 6,387,765 B2 | 5/2002 | Chhagan et al. | |
| 6,403,434 B1 | 6/2002 | Yu | |
| 6,436,841 B1 | 8/2002 | Tsai et al. | |
| 6,440,851 B1 | 8/2002 | Agnello et al. | |
| 6,444,578 B1 | 9/2002 | Cabral et al. | |
| 6,451,693 B1 | 9/2002 | Woo et al. | |
| 6,461,385 B1 | 10/2002 | Gayer et al. | |
| 6,472,283 B1 | 10/2002 | Ishida et al. | |
| 6,479,358 B1 | 11/2002 | Yu | |
| 6,596,138 B2 | 7/2003 | Shibasaki | |
| 6,600,212 B2 * | 7/2003 | Takayanagi et al. | 257/616 |
| 6,649,489 B1 | 11/2003 | Chang et al. | |
| 6,673,637 B2 | 1/2004 | Wack et al. | |
| 6,677,233 B2 | 1/2004 | Dubin | |
| 6,679,946 B1 | 1/2004 | Jackson et al. | |
| 6,713,350 B2 | 3/2004 | Rudeck | |
| 6,726,767 B1 | 4/2004 | Marrs et al. | |
| 6,727,553 B2 | 4/2004 | Kotani | |
| 6,777,759 B1 | 8/2004 | Chau et al. | |
| 6,800,213 B2 | 10/2004 | Ding et al. | |
| 6,812,045 B1 | 11/2004 | Nikoonahad et al. | |
| 6,890,391 B2 | 5/2005 | Aoki et al. | |
| 6,908,822 B2 | 6/2005 | Rendon et al. | |
| 6,924,518 B2 | 8/2005 | Iinuma et al. | |
| 6,946,371 B2 | 9/2005 | Langdo et al. | |
| 6,979,622 B1 | 12/2005 | Thean et al. | |
| 7,008,835 B2 | 3/2006 | Jin et al. | |
| 7,014,788 B1 | 3/2006 | Fujimura et al. | |
| 7,018,891 B2 | 3/2006 | Doris et al. | |
| 7,037,793 B2 | 5/2006 | Chien et al. | |
| 7,176,522 B2 | 2/2007 | Cheng et al. | |
| 7,183,662 B2 | 2/2007 | Kim et al. | |
| 7,190,036 B2 | 3/2007 | Ko et al. | |
| 7,220,650 B2 | 5/2007 | Kao et al. | |
| 7,226,832 B2 | 6/2007 | Yeo et al. | |
| 7,235,848 B2 | 6/2007 | Jeng | |
| 7,241,700 B1 | 7/2007 | En et al. | |
| 7,314,804 B2 | 1/2008 | Lindert et al. | |
| 7,355,262 B2 | 4/2008 | Ko et al. | |
| 7,358,551 B2 | 4/2008 | Chidambarrao et al. | |
| 7,358,574 B2 | 4/2008 | Choi | |
| 2001/0012693 A1 | 8/2001 | Talwar et al. | |
| 2002/0048890 A1 | 4/2002 | Wieczorek et al. | |
| 2002/0063084 A1 | 5/2002 | Lin et al. | |
| 2002/0104846 A1 | 8/2002 | Rosenfeld | |
| 2002/0135017 A1 | 9/2002 | Vogt et al. | |
| 2002/0137297 A1 | 9/2002 | Kunikiyo | |
| 2002/0142616 A1 | 10/2002 | Giewont et al. | |
| 2002/0171107 A1 | 11/2002 | Cheng et al. | |
| 2003/0038323 A1 | 2/2003 | Kotani | |
| 2003/0042515 A1 | 3/2003 | Xiang et al. | |
| 2003/0045131 A1 | 3/2003 | Verbeke et al. | |
| 2003/0098479 A1 | 5/2003 | Murthy et al. | |
| 2003/0124840 A1 | 7/2003 | Dubin | |
| 2004/0041216 A1 | 3/2004 | Mori | |
| 2004/0053481 A1 | 3/2004 | Chakravarthi et al. | |
| 2004/0118812 A1 | 6/2004 | Watkins et al. | |
| 2004/0119102 A1 | 6/2004 | Chan et al. | |
| 2004/0132291 A1 | 7/2004 | Lee et al. | |
| 2005/0090066 A1 * | 4/2005 | Zhu et al. | 438/300 |
| 2005/0112817 A1 | 5/2005 | Cheng et al. | |
| 2005/0118769 A1 | 6/2005 | Kammler et al. | |
| 2005/0121719 A1 | 6/2005 | Mori | |
| 2005/0124126 A1 | 6/2005 | Wu | |
| 2005/0130434 A1 | 6/2005 | Chien et al. | |
| 2005/0153566 A1 | 7/2005 | Han et al. | |
| 2005/0176205 A1 | 8/2005 | Chien et al. | |
| 2005/0212015 A1 | 9/2005 | Huang et al. | |
| 2005/0252443 A1 | 11/2005 | Tsai et al. | |
| 2006/0014366 A1 | 1/2006 | Currie | |
| 2006/0094215 A1 | 5/2006 | Frohberg et al. | |
| 2006/0099766 A1 | 5/2006 | Jin et al. | |
| 2006/0121688 A1 | 6/2006 | Ko et al. | |
| 2006/0131648 A1 | 6/2006 | Ahn et al. | |
| 2006/0145270 A1 | 7/2006 | Choi | |
| 2006/0151776 A1 | 7/2006 | Hatada et al. | |
| 2006/0151840 A1 | 7/2006 | Maekawa | |
| 2006/0154410 A1 | 7/2006 | Choi et al. | |
| 2006/0175686 A1 | 8/2006 | Murata et al. | |
| 2006/0202237 A1 | 9/2006 | Huang et al. | |
| 2006/0220148 A1 | 10/2006 | Furukawa et al. | |
| 2006/0252191 A1 | 11/2006 | Kammler et al. | |
| 2006/0281271 A1 | 12/2006 | Brown et al. | |
| 2007/0018205 A1 | 1/2007 | Chidambarrao et al. | |
| 2007/0042602 A1 | 2/2007 | Watkins et al. | |
| 2007/0057324 A1 | 3/2007 | Tews et al. | |
| 2007/0132013 A1 | 6/2007 | Banerjee et al. | |
| 2007/0132035 A1 | 6/2007 | Ko et al. | |
| 2007/0166937 A1 | 7/2007 | Adetutu et al. | |

OTHER PUBLICATIONS

Wolf et al., "Silicon Processing for the VLSI Era vol. 1: Process Technology", ISBN 0-91672-3-7, University of California, Sunset Beach, California, pp. 521-542.

Chau et al., "A 50nm Depleted-Substrate CMOS Transistor (DST)," 2001 IEEE, Intel Corporation, Hillsboro, Oregon.

Cohen et al., "A Self-Aligned Silicide Process Utilizing ION Implants for Reduced Silicon Consumption And Control of the Silicide Formation Temperature," vol. 716, 2002 Materials Research Society, pp. B.1.7.1-B1.7.6, Yorktown Heights, New York.

Ghani et al., "A 90nm High Volume Manufacturing Logic Technology Featuring Novel 45nm Gate Length Strained Silicon CMOS Transistors," 2003 IEEE, 3 pages.

Actions on the Merits by U.S.P.T.O. as of Feb. 18, 2008, 8 pages.

U.S.P.T.O. Actions on the Merits as of Oct. 17, 2007, 6 pages.

Nojiri et al., "Bias-Dependent Etching of Silicon In Aqueous Ammonia," Central Engineering Lab. Nissan Motor Co., 1991 IEEE, pp. 136-139, Yokosuka, Japan.

Branebjerg et al., "Dopant Selective HF Anodic Etching of Silicon," Mesa-Institute, University of Twente, 1991 IEEE, pp. 221-226, Enschede, The Netherlands.

Wang et al., "Selective Etching of N-Type silicon Using Pulsed Potential Anodization," General Motors Research Lab., 1991 IEEE, pp. 819-822, Warren, Michigan.

van den Meerakker et al., "A Mechanistic tudy of Silicon Etchingin NH3/H2O2 Cleaning Solutions," Philips Research Lab., J. Electrochem. Soc., vol. 137, No. 4, pp. 1239-1243 Eindhoven The Netherlands.

Besser et al., "Silicides for the 65 nm Technology Node," MRS Symposium Proc. 766, 2003, pp. 1-11, USA.

Actions on the Merits by the U.S.P.T.O. as of Feb. 18, 2008, 8 pages.

Actions on the Merits by the U.S.P.T.O. as of Jul. 18, 2008, 7 pages.

Actions on the Merits by the U.S.P.T.O. as of Jan. 2, 2008, 7 pages.

Van Zant, Peter, "Microchip Fabrication, A Practical Guide to Semiconductor Processing," Fifth Edition, 2004, pp. vii-xii, 73-96. 98, 100, 103-105, 268, and 495-501.

Actions on the Merits by the U.S.P.T.O. as of Nov. 19, 2008, 7 pages.

* cited by examiner

US 7,553,732 B1

INTEGRATION SCHEME FOR CONSTRAINED SEG GROWTH ON POLY DURING RAISED S/D PROCESSING

CROSS-REFERENCE TO RELATED APPLICATIONS

Related subject matter is found in a co-pending U.S. patent application, having application Ser. No. 10/791,346, filed Mar. 2, 2004, entitled "CONTAMINATION REMOVAL PROCESSES DURING SEMICONDUCTOR MANUFACTURING", which is hereby incorporated herein by reference in its entirety. Related subject matter is found in a co-pending U.S. patent application, having application Ser. No. 10/969,769 filed Oct. 20, 2004, entitled "METHOD FOR POST OFFSET SPACER CLEAN FOR IMPROVED SELECTIVE EPITAXY SILICON GROWTH", which is hereby incorporated herein by reference in its entirety. Related subject matter is found in a co-pending U.S. patent application, having application Ser. No. 10/969,771, filed Oct. 20, 2004, entitled "METHOD OF CLEANING A SURFACE OF A SEMICONDUCTOR SUBSTRATE", which is hereby incorporated herein by reference in its entirety. Related subject matter is found in a co-pending U.S. patent application, having application Ser. No. 10/969,774, filed Oct. 20, 2004, entitled "DEVICE COMPRISING AN EPITAXIAL LAYER AND METHOD THEREOF", which is hereby incorporated herein by reference in its entirety.

FIELD OF THE INVENTION

The present disclosure relates generally to a semiconductor device and manufacturing process, and more particularly to epitaxial silicon layers formed during a semiconductor manufacturing process.

BACKGROUND

The selective epitaxial growth (SEG) of thin silicon or silicon-germanium films can be used to achieve a raised source/drain region in complementary metal oxide semiconductor (CMOS) and bipolar CMOS (BiCMOS) devices utilizing silicon-on-insulator (SOI) technology.

However, epitaxial growth on the gate stack polysilicon results in a "mushroom-shaped" cap, due to unconstrained lateral growth during the epitaxial silicon growth process. When the lateral growth of this cap is excessive, a potential path for increased leakage current between the polysilicon of the gate structure and contacts landed on the source/drain area is created. In the worst case, such cap growth provides a potential for shorts between the polysilicon of the gate structure and the landed source/drain contacts, due to their close proximity.

Therefore, a method which overcomes the problems of excessive cap growth which is easily integrated into existing production facilities would be useful.

BRIEF DESCRIPTION OF THE DRAWINGS

The present disclosure may be better understood by referencing the accompanying drawings. It will be appreciated that for simplicity and clarity of illustration, elements illustrated in the Figures have not necessarily been drawn to scale. For example, the dimensions of some of the elements are exaggerated relative to other elements for clarity.

The use of the same reference symbols in different drawings indicates similar or identical items.

DESCRIPTION OF THE PREFERRED EMBODIMENT(S)

Figure 1:
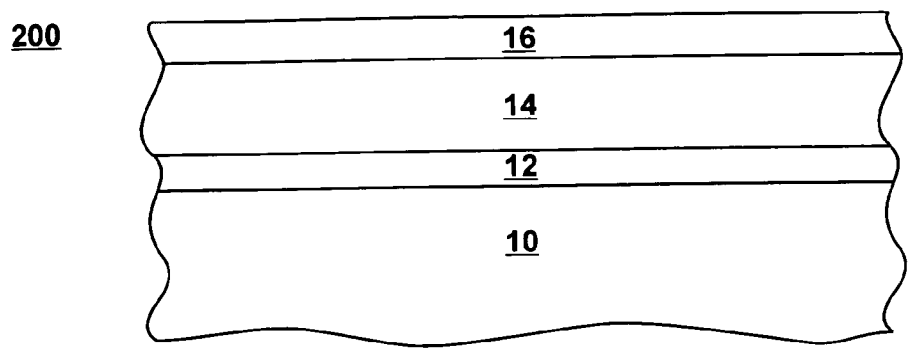
FIGS. 1 through 11 illustrate, in cross section, semiconductor device manufacturing process steps according to at least one embodiment of the present disclosure.

The present disclosure provides methods for constraining epitaxial growth on polysilicon gates to the vertical direction during an epitaxial silicon growth process. The methods are readily integrated into existing manufacturing process flows in production facilities. Further, the methods avoid problems created by epitaxial overgrowth, e.g., the "mushroom cap," resulting from unconstrained epitaxial lateral growth on gate structures.

FIGS. 1 through 6 illustrate, in cross-section, a location 200 of a semiconductor device during a manufacturing process according to an embodiment of the present disclosure. At the manufacturing stage presented in FIG. 1, the following blanket layers have been formed overlying a substrate 10: gate dielectric layer 12; a conductive gate layer 14, and a sacrificial layer 16.

Semiconductor substrate 10 can be a mono-crystalline substrate or a gallium arsenide substrate. Alternately, substrate 10 can be semiconductor-on-insulator (SOI), silicon on sapphire, or the like. Gate dielectric layer 12 can be formed by an oxide or other insulative material. Conductive gate layer 14 typically comprises doped poly silicon, but may comprise other conductive materials. Sacrificial layer 16 is used, at least in part, as a sacrificial layer to define the height of a subsequently formed sidewall spacer. The thickness of sacrificial layer 16 can be selected to depend upon the desired thickness of the silicon epitaxial growth layer that is grown in later processing steps. The sacrificial layer 16 can comprise a hard mask, such as an oxide comprising tetra ethyl orthosilicate (TEOS), amorphous carbon or other insulative material. The term "sacrificial layer" is used because, relative to the final gate structure, the layer is used for sacrificial purposes. However, the sacrificial layer may have other functions, such as an anti-reflective or etch stop layer for other processes not illustrated.

Figure 2:
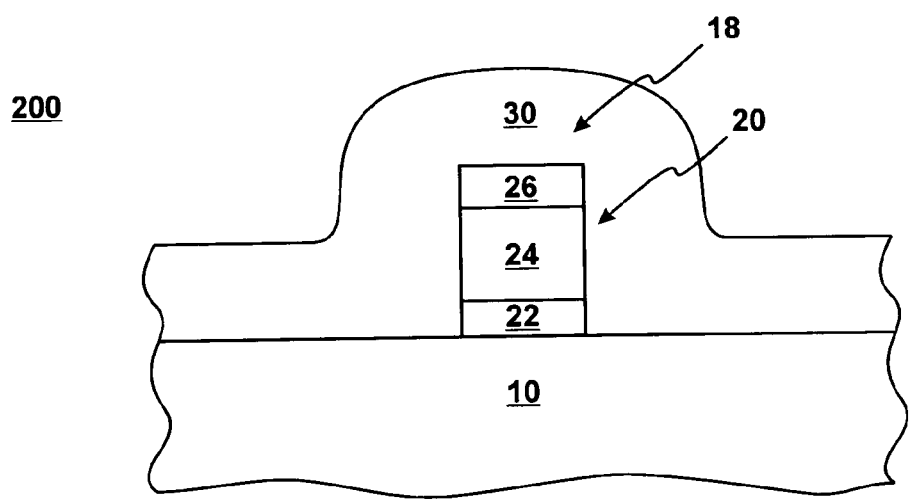

In FIG. 2, photolithography and etch processes have been conducted on portion 200 to form gate structure 18. Gate structure 18 comprises a gate stack 20 and a sacrificial gate layer 26. Gate stack 20 includes gate dielectric 22 and conductive gate layer 24 formed from layers 12 and 14, respectively.

A conformal spacer layer 30 has been formed overlying the gate structure 18. Spacer layer 30 can be formed by various deposition techniques such as PECVD (Plasma Etch Chemical Vapor Deposition), CVD (Chemical Vapor Deposition), LPCVD (Low Power Chemical Vapor Deposition), and the like. The spacer layer 30 is typically formed using a material that allows the use of an etch process selective to the material of the spacer layer 30. In an embodiment, an immediately adjacent top portion of the gate stack 20 is formed of a material that is selective to the sacrificial layer 26. In embodiments where the sacrificial layer 26 is an oxide, spacer layer 30 may be a nitride such as silicon nitride. In another embodiment, spacer layer 30 may be an oxide and sacrificial layer 26 may be a nitride. The spacer layer 30 will subsequently be etched to form spacers, as seen in FIG. 3.

Figure 3:
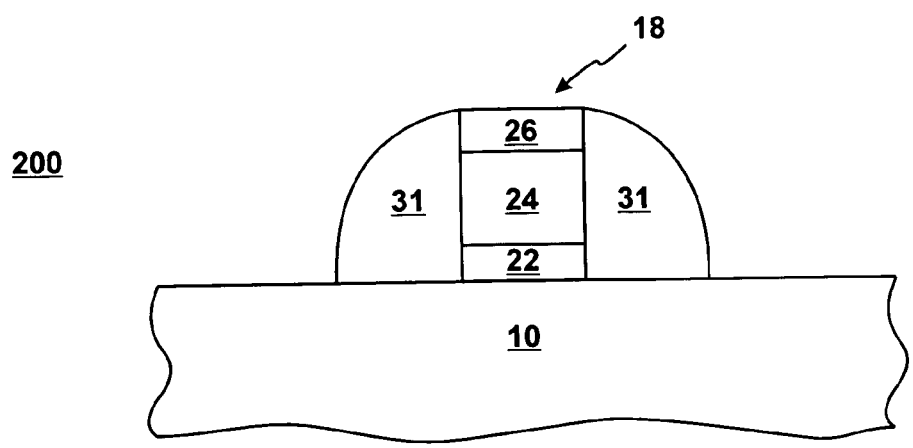
Figure 11:
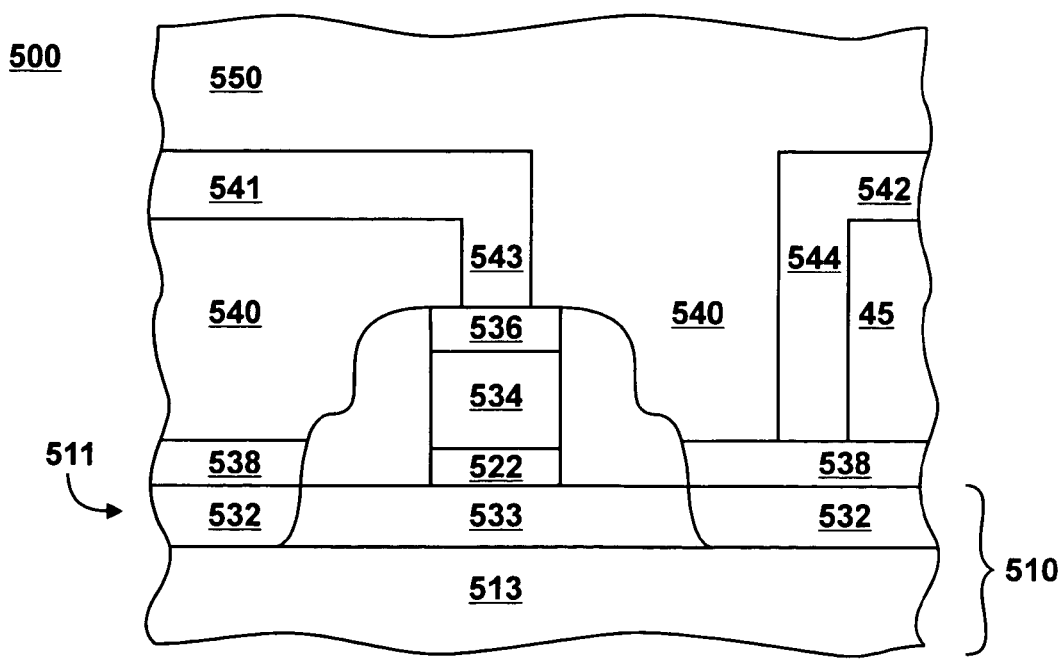

FIG. 3 illustrates location 200 following etch of spacer layer 30 to form D-shaped spacers 31 adjacent to gate structure 18. The spacers 31 are formed to have an uppermost portion that is above the interfacial region between layers 24 and 26. In FIG. 3, the uppermost portion of spacer 31 is shown to be substantially the same height as the uppermost surface of sacrificial layer 26. Generally, location 200 of FIG. 2 is subjected to an anisotropic etch process to etch spacer layer 30 to form spacers 31. Although spacers 31 are shown as being D-shaped spacers, in another embodiment, L-shaped spacers can be formed, such as are illustrated in FIG. 11.

In embodiments where spacer layer 30 is an oxide, the etch processes employed to form spacers 31 are preferably selective to the underlying sacrificial layer 26, i.e., nitride. For example, when the sacrificial layer 26 is a nitride and the spacer layer 30 is an oxide, an etch chemistry utilizing CF4/CHF3 to etch the oxide may be used. Alternatively, in embodiments where spacer layer 30 is a nitride, CF4/HBr may be used in the etch process, in order to remove the spacer layer 30 and leave the sacrificial layer 26. In specific embodiments, spacer etch processes can be monitored to detect an etch endpoint.

Figure 4:
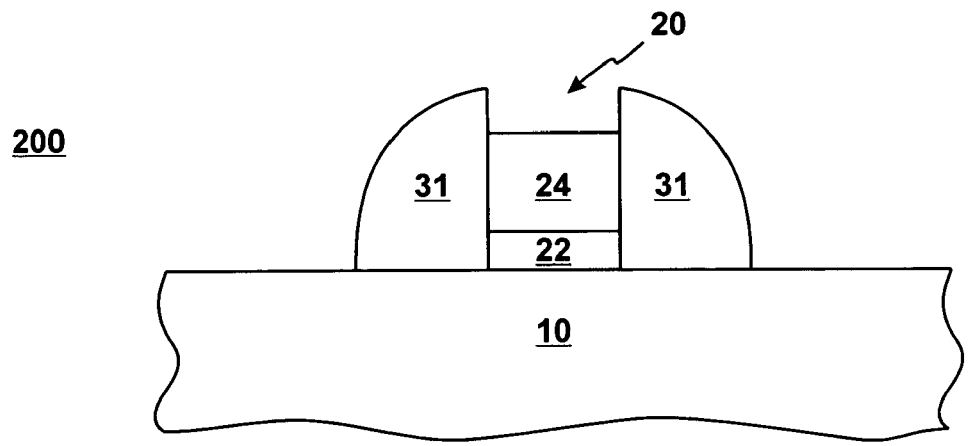

FIG. 4 illustrates location 200 after removal of the sacrificial layer 26 to leave gate stack 20. Following the spacer 31 formation, the sacrificial layer 26 is removed. Typically the sacrificial layer 26 is removed with an etch selective to the sidewalls 31. For example, in embodiments where spacers 31 are a nitride, the selective etch to remove sacrificial layer 26 is typically an etch process that has a high oxide-to-nitride selectivity, thereby leaving the sidewall substantially unetched. In embodiments where the protective layer 26 is amorphous carbon, the layer can be removed by being selectively ashed away in a plasma stripping process.

Figure 5:
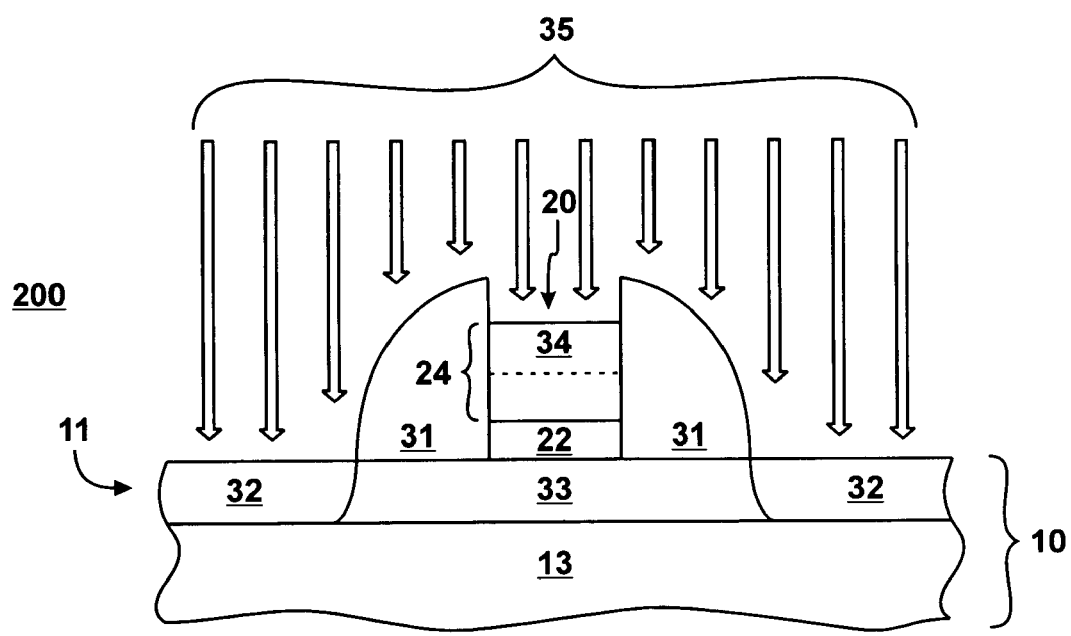
Figure 6:
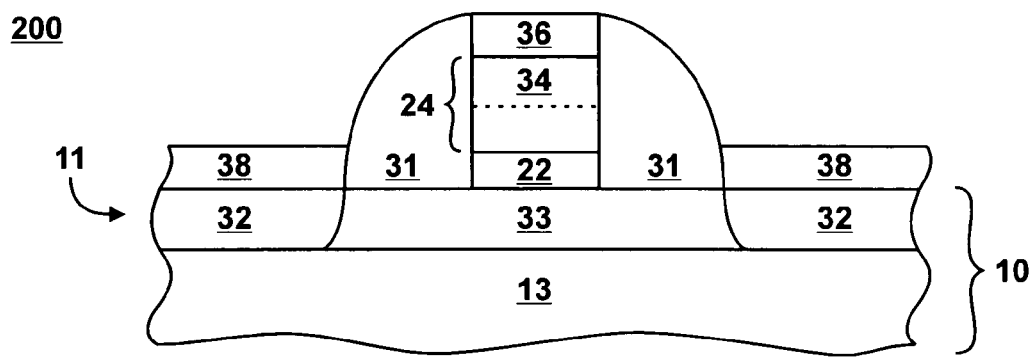

As a result of the removal of sacrificial layer 26, an uppermost portion of the sidewalls 31 extends above the top surface of the gate conductive layer 24, and will cause subsequent silicon epitaxial growth on the conductive gate portion 24 to proceed in a vertical direction, with no lateral growth, as seen in FIG. 6. Once the selective removal of the protective layer is complete, portion 200 is ready for further processing, for example, a dopant implantation process to create doped regions in gate conductive layer 24 and in active regions adjacent to the gate structure 20, as seen in FIG. 5.

FIG. 5 illustrates location 200 during a dopant implantation process 35. The doping process creates doped active regions 32, which may be deep source/drain (S/D) regions. Note that extension regions, not shown in FIG. 5, may be previously formed. In addition, a doped portion 34 is formed within the conductive gate layer 24. The dotted line within conductive gate layer 24 is intended to indicate one possible outcome for the extent of the doped region 34. In other embodiments, the dopant implantation process may occur following the formation of an epitaxial growth layer, or the dopant implantation may be through the entire thickness of the conductive gate structure. Note that the conductive gate structure 24 may be doped or undoped silicon prior to the implantation illustrated in FIG. 5.

When undoped prior to FIG. 5, the conductive gate layer 24 would be in a semiconductive state, and the doping process 35 would be used to facilitate making the conductive layer 24 conductive. As illustrated in FIG. 5, a region 33 is shown underlying the gate structure 20 in the substrate 10. Typically, this region will include extension implants (not shown). In accordance with one embodiment, the substrate 10 is a SOI substrate, with layer 11 being a semiconductive layer, and layer 13 being an insulative layer.

FIG. 6 illustrates, in cross-section, the location 200 of FIG. 5 following a silicon epitaxial growth process used to create layers 38 and 36 overlying silicon-comprising portions 32 and 34 respectively. Layer 38 is a raised source/drain region.

Because of the selective removal of the sacrificial layer 26, the sidewalls 31, which extend above the gate structure 24, constrain epitaxial layer 36 to having a vertical component, and no lateral component relative to the footprint of the conductive gate 24. Therefore, as shown in FIG. 5, the epitaxial layer 36 overlying the gate conductive layer 34, where the sacrificial layer 26 was formed, is constrained to the footprint of the top of the gate conductive layer 34. Hence, no "mushroom cap" is present when utilizing the teachings of the present disclosure.

The epitaxial layers 38 and 36 may be doped, or undoped, depending upon device requirements. For example, the epitaxial layers 38 and 36 in FIG. 6 can remain undoped, when the underlying S/D regions 32 were doped prior to growth of the silicon epitaxial layers 138 and 136. In other embodiments, the epitaxial layers 138 and 136 may be doped.

Figure 7:
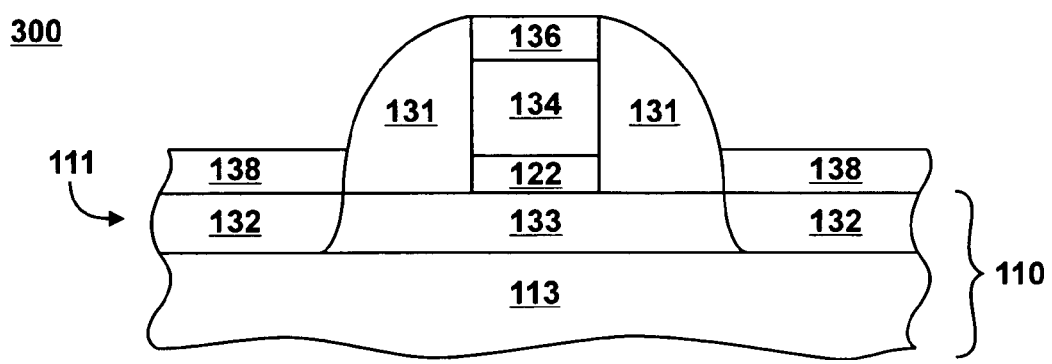

FIG. 7 illustrates a cross sectional view of a location 300 of a semiconductor device after silicon epitaxial growth of layers 138 and 136, but before any doping has occurred. In FIG. 7, the regions 132 in substrate portion 111, and the conductive gate layer 134 have not undergone dopant implantation. Various options exist for dopant implantation, depending upon device requirements. As previously mentioned, it will be appreciated that there may be one or more doping steps prior to forming epitaxial layers followed by subsequent doping of epitaxial layers. Alternatively, doping semiconductor layer 111 can occur prior to epitaxial 138, 136 layer growth, with no doping of the epitaxial layer 138, 136. Another alternative is to not dope prior to epitaxial layer 138, 136 growth.

Figure 8:
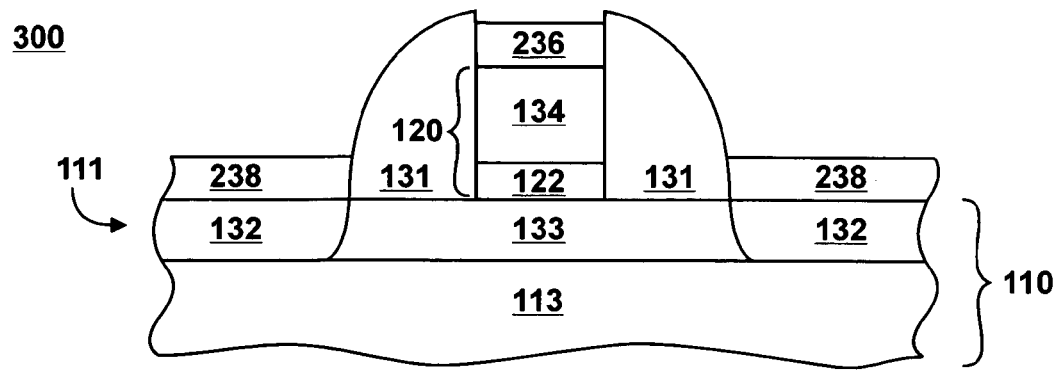

As illustrated in the embodiment of FIG. 8, the epitaxial layer 236 has been formed to have a thickness that is less than the thickness of the sacrificial layer previously formed and removed overlying the conductive gate layer 134, thereby resulting in the top of the epitaxial layer 236 being below the topmost portion of the sidewall spacers 131. In another embodiment, e.g., FIG. 7, the thickness of the epitaxial layer is substantially the same as the thickness of the sacrificial layer 26.

Figure 9:
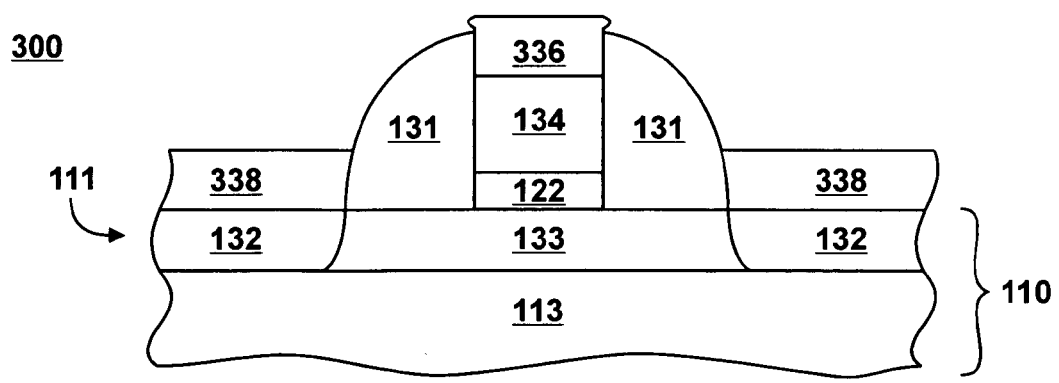

FIG. 9 illustrates an embodiment where the thickness of a top portion of the epitaxial layer 336 is greater than the sacrificial layer originally formed while the bottomed portion is laterally constrained. This may result in a slight lateral spread during the epitaxial process, as seen in mushrooming of the epitaxial layer 336 over the tops of sidewalls 131. However, the amount of lateral spread is reduced over that previously obtainable. The amount by which the epitaxial layer thickness is greater than the thickness of the sacrificial layer formed will vary based upon the device technology, e.g., the proximity of contacts, but will typically be less than 50%.

Figure 10:
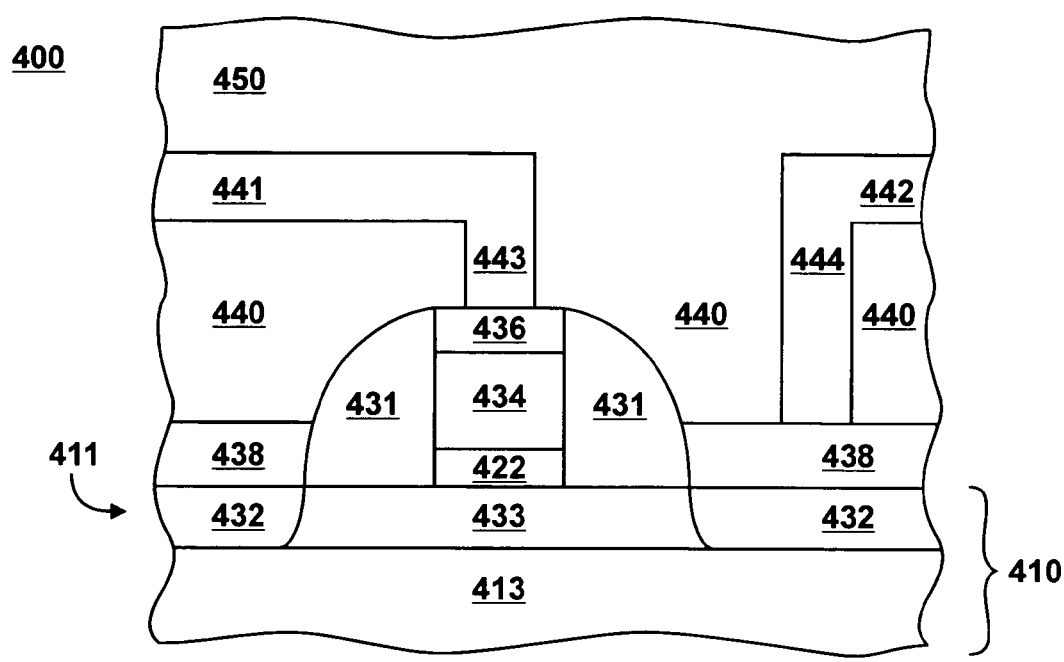

FIG. 10 illustrates a cross-sectional view of a location 400 of a semiconductor device manufactured according to an embodiment of the present disclosure. FIG. 10 is a simplified illustration which does not show all of the features of the device in order to keep the illustration from being cluttered. In FIG. 10, the regions 438 and the gate region 436, created using the epitaxial process as disclosed herein, are shown integrated into the transistor at location 400. Location 400 is further illustrated to have interconnects 441 and 442, which are connected to vias/contacts 443 and 444 within an interconnect dielectric region 440. A passivation layer 450 has been formed overlying portion 400.

In portion 400, a gate stack overlies a silicon layer 411 of a semiconductor substrate 410. The stack includes a gate dielectric 422, conductive gate portion 434, and an epitaxially-grown layer 436 having an interface surface immediately adjacent to the upper surface of the gate portion 434. Substrate 410 includes a semiconductor layer 411 that comprises channel region 433, and source/drain regions 432. When substrate 410 is an SOI wafer, the layer 413 represents a buried oxide (BOX) layer. D-shaped spacers 431 immediately adjacent to the conductive gate portion 434 have been formed according to the teachings herein.

The present disclosure provides for many variations in the finished device. For example, in an alternate embodiment illustrated by the location 500 of FIG. 11, L-shaped spacers 537 may be utilized instead of the standard D-shaped spacers 531 shown in FIGS. 3-10. The principle difference between FIG. 10 and FIG. 11 is the choice of shape of the spacer.

Figure 12:
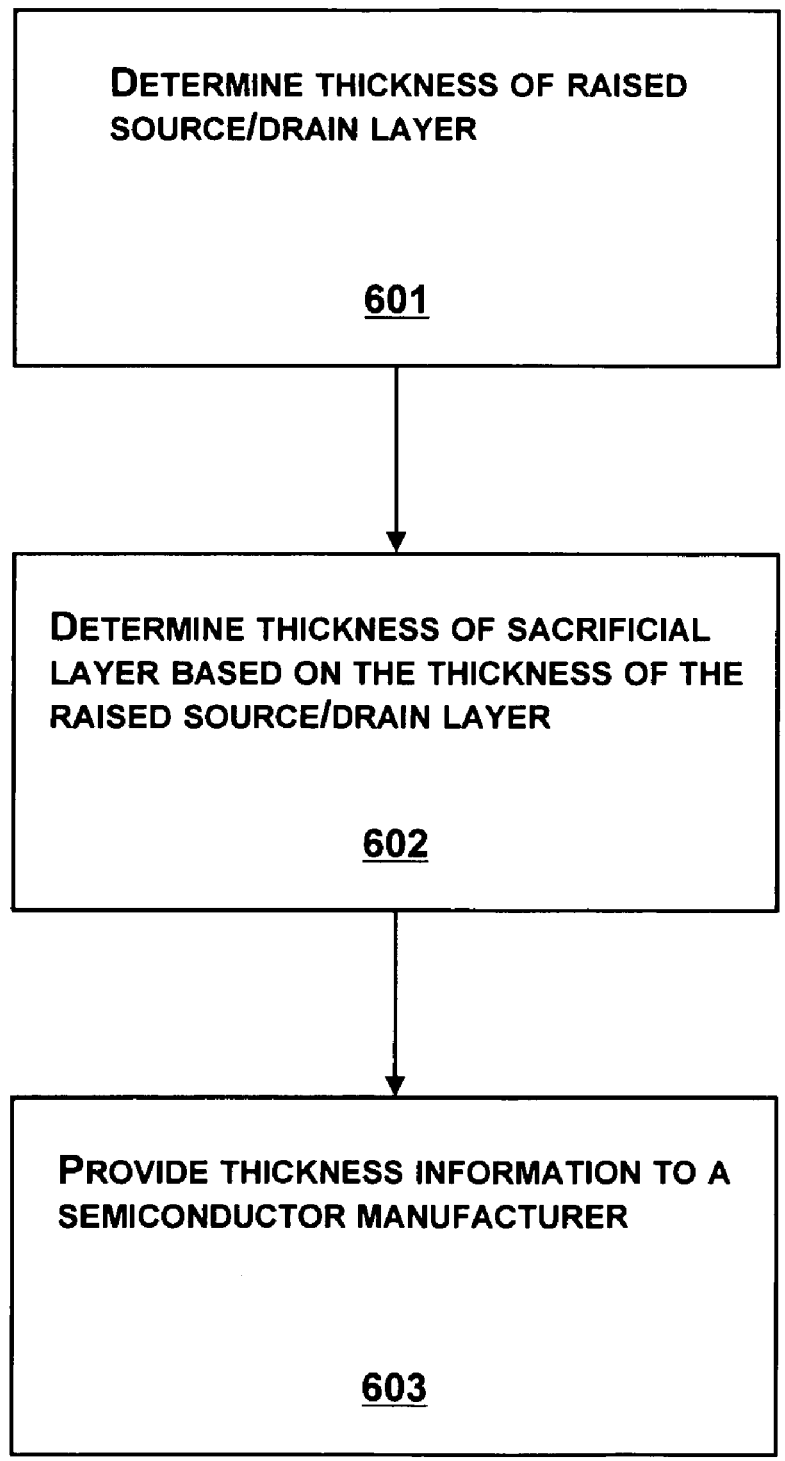
FIG. 12 is a flow diagram illustrating a method for determining a desired thickness of an epitaxial layer according to at least one embodiment of the present invention.

FIG. 12 is a flow diagram illustrating a methodology to determine a desired thickness of an epitaxial layer to be formed over an SOI substrate. At step 601, a determination is made as to the desired thickness of the raised source/drain (S/D) layer, that is, the thickness of the epitaxial layer which will form the raised S/D. At step 602, a thickness of a sacrificial layer to be formed overlying a polysilicon gate portion is determined based upon the desired height of the epitaxial layer. These desired height and thickness values would then be provided to a semiconductor device fabrication facility at step 603. The manufacturer would, in turn, fabricate a device based upon the desired height and thickness values.

The method and apparatus herein provides for a flexible implementation. Although described using certain specific examples, it will be apparent to those skilled in the art that the disclosure is not limited to these few examples. For example, the disclosure is discussed herein primarily with regard to nitride spacer formation and use of a sacrificial layer to serve as a hard mask for subsequent epitaxial silicon growth for a CMOS device, however, the disclosure can be employed with other device technologies to create spacers and avoid exceeding lateral boundaries created by SEG processes during device manufacture. Additionally, various types of deposition and etch devices are currently available which could be suitable for use in employing the method as taught herein. In addition, although this disclosure has been discussed primarily with regard to the use of an oxide sacrificial and nitride spacers, this does not preclude the use of a nitride sacrificial layer and oxide spacers, or the use of an organic anti-reflective coating (ARC) layer as the sacrificial layer or hard mask over the gate structure. Other combinations of materials and suitable etch chemistries suitable to practice the teachings herein may be utilized. Note also, that although an embodiment of the present disclosure has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

It will be appreciated that the above disclosure can be implemented using a variety of techniques. For example, it will be appreciated that any number of substrate preclean steps can occur before the formation of any epitaxial layer. For example, U.S. patent application having Ser. No. 10/791, 346, which is hereby incorporated in its entirety by reference, discloses several substrate preclean techniques appropriate for cleaning a substrate prior to forming an epitaxial layer.

In one example, contaminates on the surface of a substrate are subjected to a cleaning process comprising applying a plasma to a surface of the active regions produce a reduction reaction with the contaminates in an upper portion of the surface of the active regions. In an embodiment, the plasma comprises $H_2$. While the plasma is being applied to the upper portion of the exposed active regions, the resultant products or vapor byproducts of the reduction reaction are removed by the normal vacuum process within the chamber. Therefore, contaminates contained in the vapor byproducts and are vented away, leaving the upper portion of the surface of the active regions suitably clean for the ensuing epitaxial process. In one embodiment, the plasma process parameters comprise a gas flow of 450 sccm H2 and 300 sccm argon, at a chamber temperature of 400 degrees Celsius, with an high frequency (HF) power setting of 700 W, and a low frequency (LF) power setting of between approximately 50 to 100 W. Chamber pressure is 1 Torr, and the spacing between the surface of the active region and the faceplate of the tool (not shown) should be 300 mils. In other embodiments, plasma process parameters comprise a gas flow ranging from between 100-800 sccm $H_2$ and from between 100 and 600 sccm argon. Chamber temperatures can range between 300 to 450 degrees Celsius, and HF power settings from between 400-900 W, with LF power settings varying from between 0-150 W. Chamber pressures can range from between 1 mT-5 Torr, with spacing between the surface of the active region and the faceplate of the tool varying from between 200 to 400 mils. Exposure times for the various embodiments utilizing plasma range from between approximately 10 seconds up to approximately 120 seconds.

Various tool types are suitable for this cleaning, for example, CVD (Chemical Vapor Deposition) equipment, HDP (High Density Plasma) tools, etch chambers, or the like. Differences in chamber design, power settings, and species, e.g., $H_2$ with or $H_2$ without helium or nitrogen, will result in different thickness of the layer after anneal. Typically the layer after anneal will be between 20 and 50 Angstroms thick. This plasma cleaning process also results in passivation of Si—H bonds in the layer after anneal. No wet cleaning dip with hydrofluoric (HF) acid prior to SEG is necessary.

In addition to no longer requiring an HF dip prior to SEG, the reduced temperature of this $H_2$ plasma cleaning treatment results in a reduction of the SEG process thermal budget of more than 100 degrees Celsius. Typically pre-SEG cleaning processes are conducted at approximately 900 degrees Celsius or greater. In an embodiment of the present disclosure, the cleaning process occurs at less than approximately 800 degrees Celsius. In another embodiment, the cleaning process occurs at less than approximately 500 degrees Celsius or less. In addition, the cleaning processes of the present disclosure could be conducted at less than approximately 700 degrees Celsius or less, or even at less than approximately 600 degrees Celsius or less.

In another embodiment, location including includes a gate structure and active regions is subjected to a cleaning process utilizing a low-power dry etch to selectively remove an upper atomic layer of material from the active regions. The thickness of the upper atomic layer of material to be removed ranges from between 20 to about 50 Angstroms. In one embodiment, the dry etch process is an anisotropic dry etch utilizing a carbon-free gas as an etchant gas. In another embodiment, the anisotropic dry etch utilizes an oxygen- and carbon-free gas as an etchant gas. The etchant gas can comprise HBr, $NF_3$, $SF_6$, gaseous fluorine-interhalogenics such as $ClF_3$, or any gas containing fluorine, suitable to disassociate F-radicals, which does not contain oxygen and carbon. Prior to undergoing the anisotropic dry etch process, location 200 is subjected to a standard wet etch chemistry process utilizing a dilute HF solution (100:1) at room temperature, e.g., 20 to 26 degrees Celsius, for a time period ranging from 50 to 200 seconds. Following the HF clean, a low-power dry etch utilizing a temperature of approximately 400 degrees Celsius, RF power of approximately 375 W, pressure of approximately 150 mTorr, and a gas flow rate ranging from 50 to 100 sccm, is conducted. In other embodiments, the low-power dry etch utilizes a temperature ranging from between 300-500 degrees Celsius, with RF power ranging from between 200-700 W, a pressure ranging between 0-1 Torr, and a gas flow rate ranging from between 10-300 sccm, for a time ranging between 10 to 60 seconds.

This low-power dry etch removes carbon and oxygen contamination, and provides a very clean surface for SEG. The low temperature HF clean followed by the low-power dry etch does not require a high temperature bake. This results in a reduction of thermal budget for SEG of more than 100 degrees Celsius.

In another embodiment, a cleaning process is used that forms an oxidation layer of between 20 to 50 Angstroms on an upper surface of the active regions using a plasma to produce the oxidation layer on doped active regions. In an embodiment, the plasma is an $O_2$ plasma. In another embodiment, the plasma is an $O_3$ plasma.

An $O_2$ plasma production utilizes $O_2$ gas at a flow rate of 400 sccm, a pressure of 5 Torr, an HF of 300 W, an LF of 100 W, and a temperature of 400 degrees Celsius, with the time ranging from between about 10 to about 120 seconds. The spacing between the surface of the active regions and the faceplate of the vapor deposition apparatus (not shown) should be 400 mils. In other embodiments, the plasma production utilizes $O_2$ gas at a flow rate of between 100 and 1000 sccm, a pressure ranging from between 2-10 Torr, an HF ranging between 200-500 W, an LF ranging between 50-200 W, a temperature ranging between 300-450 degrees Celsius, for a time ranging from between approximately 10 to approximately 120 seconds. In an embodiment, the spacing between the surface of the active regions and the faceplate of the vapor deposition apparatus ranges from between 200 and 600 mils. The tool type used to generate the plasma could be CVD equipment, HDP tools, or etch chambers. In an embodiment where the plasma is $O_3$, plasma production utilizes $O_3$ gas at a flow rate of 300 sccm, a pressure of 5 Torr, an HF of 300 W, an LF of 100 W, and a temperature of 400 degrees Celsius for a time period ranging from between 10 to 120 seconds. The spacing between the surface of the active regions and the face plate of the vapor deposition apparatus (not shown) should be 400 mils. In other embodiments, plasma production utilizes $O_3$ gas at a flow rate of between 50 and 600 sccm, a pressure ranging from between 2-10 Torr, an HF ranging between 200-500 W, an LF ranging between 50-200 W, and a temperature ranging from between 300-450 degrees Celsius for a time period ranging from between about 10 to about 120 seconds. In an embodiment, the spacing between the surface of the active regions and the faceplate of the vapor deposition apparatus ranges from between 200 and 600 mils. As was the case with the $O_2$ plasma, the tool type used to generate the plasma could be HDP tools, CVD equipment, or etch chambers.

Forming the oxidation layer facilitates trapping or fixing contamination in the oxide layer overlying the upper layer of the doped active regions for subsequent removal using a wet chemistry process. The wet etch chemistry process utilizes a dilute HF acid solution of 100:1 at room temperature, e.g. 20 to 26 degrees Celsius, for a time ranging from 50 to 200 seconds. Differences in chamber design, power settings and species employed, e.g., $O_2$ or $O_3$, results in differing thickness of the oxidation layer, hence the wide range in times for the HF dip. The use of an $O_2$ or $O_3$ plasma to create a contamination-trapping oxidation layer for removal by a room temperature HF dip results in a reduction of the thermal input for location 300.

Another possible pre-clean for use prior to formation of an SEG is disclosed in U.S. patent application having Ser. No. 10/969,769, which is hereby incorporated in its entirety by reference, discloses another substrate preclean technique that facilitates a reduced temperature $H_2$ bake is performed following formation of any desired spacers, which can comprise one or more nitride or oxide layers and prior to SEG formation. This pre-clean and comprises a first pre-rinse with deionized water, followed by an oxide etch utilizing an aqueous solution of deionized water and hydrofluoric acid (HF or hydrogen fluoride in water) aqueous solution of approximately 30:1 (volumetric ratio) at 21 degrees Celsius, for a time period ranging from between 50-60 seconds. The weight percentage of HF recommended for the HF aqueous solution is 49% in a balance of deionized water ($H_2O$). Bulk HF aqueous solution can be purchased from various chemical suppliers in the HF weight percent range of 10% to 49%. In semiconductor fabrication facilities, this aqueous HF aqueous solution is typically diluted in the range 10:1 to 200:1. A 10:1 HF is 1 part aqueous HF (at 49% weight percent) and 10 parts $H_2O$. It will be appreciated that the etch rate of the HF aqueous solution is substantially linear with respect to both the concentration of the HF aqueous solution and the etch time. Therefore, various combinations of HF concentrations and etch times can be used to accomplish the oxide etch. Additionally, the temperature may vary.

After the HF etch, an overflow rinse utilizing deionized water is performed for a period ranging from approximately 120 to 600 seconds with a typical rinse being about 400 seconds. The cleaning process of portion 100 results in etching away of the surface contamination/debris located on substrate 10 resulting from offset spacer formation and/or dopant implantation. The upper semiconductor surface, i.e. silicon surface, of substrate 10 is also slightly etched, for example, from one to several mono layers of silicon, during the HF etch.

It should be noted that the amount of material removed during the HF etch is dependent upon the type of material being removed. For example, when native oxide is present, the HF etch will remove approximately 20 to 30 Angstroms of oxide. If a deposited oxide layer is present in addition to a native oxide, an over-etch of approximately 30% is generally desirable. For example, if removal of 100 Angstroms of a chemical vapor deposition (CVD) oxide is desired, the HF etch could be employed to remove approximately 120 to 130 Angstroms oxide removal. This latter example would be applicable in applications where a liner oxide of approximately 100 Angstroms thickness is employed between a conductive gate 25 and a nitride spacer.

The next steps in the cleaning process comprise a second pre-rinse with deionized water of approximately 30 seconds duration precedes the performance of a Standard Clean-1 (SC-1), a quick dry rinse (QDR), and a Standard Clean-2 (SC-2). The SC-1 and SC-2 components are followed by a second QDR, and an HF: $H_2O$ etch, a third rinse, and an isopropyl alcohol (IPA) dry. The amount of material removed by the SC-1 and SC-2 components are implemented such that they etch from approximately one monolayer of silicon to approximately 10 to 100 Angstroms of silicon.

In an embodiment, the SC-1 utilizes an aqueous solution of ammonium hydroxide: hydrogen peroxide: deionized water at a ratio of approximately 1: 1-4:6-40, at a temperature of approximately 60 degrees Celsius for approximately 72 minutes, to etch approximately 100 Angstroms of silicon. Synonyms for ammonium hydroxide ($NH_4OH$) include ammonia solution (typically contains between 12% and 44% ammonia before dilution), dilute ammonia, or concentrated ammonia. A first quick dry rinse is conducted for approximately 3 minutes. In an embodiment, the SC-2 utilizes a solution of hydrochloric acid: hydrogen peroxide: deionized water at an initial ratio of approximately 1:1:50 at a temperature of approximately 60 degrees for about 5 minutes. A second quick dry rinse is then conducted. Synonyms for hydrochloric acid (HCl) are hydrogen chloride, anhydrous hydrogen chloride, aqueous hydrogen chloride, chlorohydric acid, spirit of salts, and muriatic acid.

In a particular embodiment, the SC-1 utilizes a solution of ammonium hydroxide: hydrogen peroxide: deionized water at a ratio of approximately 1:4:20 at a temperature ranging of approximately 60 degrees Celsius for approximately 72 minutes. The SC-1 is the step in the clean sequence that etches the silicon. This occurs because the $H_2O_2$ (the oxidizer) becomes depleted in the solution with increasing time and increasing temperature. The methods of the present disclosure allow the initial concentration of hydrogen peroxide to be depleted to facilitate etching of the upper-most semiconductor portion. Depletion of the $H_2O_2$ is greatly enhanced when the solution temperature rises above 80 degrees Celsius, which can lead to an etch that is difficult to control if not carefully monitored. The temperature range of the SC-1 is expected to be approximately 55 to 85 degrees Celsius, with the etch occurring in a shorter period of time at higher temperatures than at lower temperatures. It is expected that the SC-1 etching will be better controlled at temperatures in the range of 55-80 degrees Celsius and better still at temperatures in the range of 55-75 degrees Celsius. Generally, it is expected that the substrate will be exposed to the SC-1 etch process for longer that 60 minutes. When the oxidizer stops protecting the silicon surface, the ammonium hydroxide ($NH_4OH$) starts to etch the silicon. Thus, a small amount of silicon can be etched in a controlled manner. The SC-1 can be performed in a re-usable bath where the solution is re-circulated and heated to maintain the desired temperature.

The mechanism of silicon and $SiO_2$ etching by a $NH_4OH/H_2O_2$ solution occurs when the solution is allowed to be depleted of $H_2O_2$. An alkaline solution, such as NH4OH4 in our example, will attack silicon by water molecules, according to the reaction:

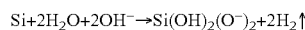
$$Si+2H_2O+2OH^- \rightarrow Si(OH)_2(O^-)_2+2H_2\uparrow$$

A passivation layer formed by the $H_2O_2$ prevents this attack by the $NH_4OH$. $H_2O_2$ decomposes in the course to form $O_2$ and $H_2O$.

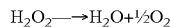
$$H_2O_2 \longrightarrow H_2O+\tfrac{1}{2}O_2$$

When the concentration of $H_2O_2$ is below $3\times10^{-3}M$, then silicon will begin to etch, because of the absence of the inhibition layer.

As indicated in the above equations, heat is given off as the $H_2O_2$ is depleted. If a bath is used that is not recharged with fresh solution all $H_2O_2$ will be depleted, thereby no longer releasing heat. Therefore, the temperature can be monitored on the low end to indicate when the solution should be refreshed, while the temperature on the high end is monitored to prevent unusually rapid decomposition of the $H_2O_2$, which can lead to a process that is difficult to control.

The first quick dry rinse is conducted for approximately 3 minutes. The subsequent SC-2 utilizes a solution of hydrochloric acid: hydrogen peroxide: deionized water at a ratio of approximately 1:1:50 at a temperature of approximately 60 degrees for about 5 minutes. A quick dry rinse with deionized water, followed by an IPA dry process, is performed following the SC-2.

The IPA dry process uses a heated IPA vapor at approximately 82 degrees Celsius. The IPA vapor is generated in a separate chamber with 100% $N_2$ bubbled through 100% IPA (heated to 82 degrees Celsius). The IPA condenses on the wafer, and the solution drips off the bottom of the wafer. The IPA vapor concentration is slowly diluted to 100% $N_2$ before the wafers are removed from the rinsing/drying tank.

Subsequent to the SC-1 and SC-2 processes, the substrate will be further recessed (etched) as a result of the cleaning process. Next, an $HF:H_2O$ etch can be conducted at an aqueous solution ratio of 200:1 for about 65 seconds, which typically results in approximately 30 Angstroms of oxide removal. The $HF:H_2O$ etch 8 is followed by a rinse with deionized water for approximately 10 minutes duration. The deionized water rinse is followed by an IPA dry as described in the preceding paragraph. At this time, the source/drain regions of the substrate are ready for ion implantation or selective epitaxial growth.

In a particular embodiment, the SC-1 process comprises a pre-rinse with deionized water of approximately 30 seconds duration. The pre-rinse is followed by a SC-1 solution at a ratio of approximately 1:1-4:6-40, which includes the sub-ranges of 0.25:1:5, 0.5:1:5, 1:1:5, 1:1:6, 1:4:20, and 1:1:40, ammonium hydroxide: hydrogen peroxide: deionized water at a temperature of approximately 60 degrees Celsius for approximately 5 minutes. A quick dry rinse (QDR) is then performed for approximately 3 minutes.

Following the SC-1 cleaning process, an SC-2 cleaning process is performed. In an embodiment, the SC-2 cleaning process includes utilizing an aqueous solution of hydrochloric acid: hydrogen peroxide: deionized water at a ratio of approximately 1:1:50 at a temperature of approximately 60 degrees Celsius for approximately 5 minutes. A QDR is then performed, and portion 200 is ready for the third cleaning. The weight percent composition of the hydrochloric acid: hydrogen peroxide: deionized water is 29% (weight percent) hydrochloric acid and 30% (weight percent) hydrogen peroxide in a balance of deionized water.

After the SC-1 and SC-2, a third cleaning process comprising an approximate 30 second pre-rinse, an oxide etch, an overflow rinse and an IP dry is performed. The oxide etch is accomplished utilizing a solution of deionized water and hydrofluoric acid at a ratio of approximately 200:1 for a time period ranging from between 450-650 seconds. Following the HF etch, an overflow rinse is performed for approximately 10 minutes. A final isopropyl alcohol (IPA) dry is then performed. Approximately 120-140 Angstroms of the surface of substrate 20 is removed in this process. Portion 200 is ready to undergo selective epitaxial growth.

The above-described cleaning process has been found to facilitate formation of an epitaxial layer on a semiconductor surface, specifically silicon. Because various etch processes can etch N- and P-type regions at different rates, it can be useful to amorphize an upper-most surface of the source/drain regions prior to the above-described clean to reduce any preferential etch differences between substrate regions of differing dopant types.

For example, the above-described clean process can etch the N-type silicon preferentially, as compared to the P-type silicon, resulting in a quality difference of the SEG between the N and P regions after SEG processing. Etch rate differences between N- and P-type regions can allow for contaminates to remain in the lesser-etched region. For example, an etch process that does not etch P-type regions at the same rate as N-type regions can result in P-regions maintaining embedded carbon that is incorporated from previous process steps. Without appropriate etching of silicon in the P-type regions during the clean, the carbon will remain, and the SEG will grow inconsistently. A high bake temperature of 900° C. can be used to overcome this growth issue on P areas, however, as stated previously, high bake temperatures can be detrimental to the device in that it causes diffusion and deactivation of the dopants. Amorphizing the source/drain regions can reduce etch differences associated with the above-described cleaning process as well as other processes that are used to etch doped substrate regions, thereby improving the quality of both the N and P regions.

It has been observed that the selective etching may be P-type over N-type, or N-type over P-type depending on the solution temperature, flow rate of the aqueous ammonia, concentration of the aqueous ammonia, agitation, or illumination of light. By amorphizing the silicon in this manner to a pre-defined depth, it has been observed that unbiased etching to the depth of the amorphized silicon can be achieved.

In one embodiment, N- and P-type extensions formed in the source/drain regions are amorphized by being implanted with the Xe, at a dose of 2E14 and energy of 10 keV, to create an amorphous depth of 100 A.

In accordance with another embodiment, a spacer structure having an undercut can be used to reduce or inhibit facet formation during a selective epitaxial growth process. Such a process can allow for greater lateral uniformity of junction or silicide features during implantation or silicidation processes, and can be accomplished by using a spacer formed with a bi-layer of materials, e.g., a thin liner, such as portion 29 of FIG. 1, of one material underlying another layer of material from which the 'main' spacer is formed. The thin liner and other material layer are selected such that the two materials are selectively etchable with respect to the other, for example, a thin oxide liner and a nitride layer. By etching the underlying portion of the spacer, an undercut can be formed that reduces facets during epitaxial formation.

In another embodiment, a method of germanium-content engineering can be used during a selective epitaxial growth (SEG) process to form raised source drain regions, such that the germanium-content is engineered to facilitate subsequent cobalt-silicidation, or for nickel silicide processes. For example, U.S. patent application having Ser. No. 10/969,774, which is hereby incorporated in its entirety by reference, discloses such a technique.

The SEG formation process commences with a germanium content on the order of between approximately 3-5% to ensure good growth conditions at high growth rates for both N- and PMOS. The germanium content is reduced during growth of the upper portion of the SEG layer (raised source/drain region) to provide a good substrate for subsequent cobalt silicidation. Thus the raised source drain region comprises a first portion nearest the semiconductor substrate having a Ge content greater than a second portion of the raised source drain furthest from the substrate. Due to the reduction in germanium during growth of the upper portion of the SEG layer, the germanium-to-silicon ratio in the first portion closest the substrate will be different (typically greater than) from the germanium-to-silicon ratio in the uppermost portion of the SEG layer.

This method permits increased throughput for SEG at reduced thermal budget, as well as the ability to continue using cobalt rather than nickel for the silicide layer. Using a graded SEG as described allows for a self-limiting or self-stopping cobalt silicidation process, due to the higher conversion temperatures required to create cobalt-silicide in the presence of germanium. Utilizing the methods during the manufacture of CMOS devices results in reduced junction leakage. A reduction in junction leakage results in improved device performance.

In one embodiment, a dopant profile for a Ge-to-Si ratio where a portion of SEG 38 closest to an underlying substrate will typically have a Ge-to-Si ratio in the range from 15% to 35%. While the portion of SEG 38 furthest from the substrate 10 typically has a reduced Ge-to Si ratio in the range from 0% to 2.5%. Note that listed percentages are atomic percentages unless otherwise stated.

Following the formation of the Ge-gradient in the source/drain regions, a silicidation process is carried out to form a silicide layer overlying a portion of the raised source/drain region. In an embodiment, the silicide layer comprises cobalt disilicide ($CoSi_2$). In an embodiment, the cobalt disilicide is formed at a temperature ranging from 600 to 800 degrees Celsius. Formation of the cobalt disilicide further comprises depositing a cobalt metal, performing a first anneal at a temperature ranging from 450 to 550 degrees Celsius, performing a wet strip with a sulfuric peroxide mixture followed by a wet strip with an ammonium peroxide mixture, and performing a second anneal at a temperature ranging from 600 to 800 degrees Celsius.

In another embodiment, the silicide layer comprises nickel silicide (NiSi). In an embodiment, the nickel silicide is formed at a temperature ranging from 350 to 500 degrees Celsius. The nickel silicide is formed by depositing a nickel metal and performing an anneal at a temperature ranging from 350 to 500 degrees Celsius. Following the anneal, a wet strip with a sulfuric peroxide mixture is performed, followed by a wet strip with an ammonium peroxide mixture. It should be noted that more than one anneal may be utilized to form the nickel silicide, e.g., a two step anneal process such as a first anneal at a temperature ranging from 300 to 400 degrees Celsius following nickel metal deposition, performing the wet strips, then performing a second anneal at a temperature ranging from approximately 400 to 500 degrees Celsius.

The method and apparatus herein provides for a flexible implementation. Although described using certain specific examples, it will be apparent to those skilled in the art that the examples are illustrative, and that many variations exist. For example, the disclosure is discussed herein primarily with regard to independent control of the placement of a silicide and the amount of offset of a source/drain region from a gate structure for a CMOS device, however, the invention can be employed with other device technologies to create deep source/drain offsets and determine silicide location during device manufacture. Additionally, various types of deposition and etch devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of manufacturing a semiconductor device comprising:
   forming a gate structure overlying a semiconductor substrate comprising a gate stack and a sacrificial layer;
   forming a sidewall spacer adjacent to the gate structure;
   selectively removing the sacrificial layer after forming the sidewall spacer to expose a surface of the gate stack; and
   forming an epitaxial layer overlying an active region adjacent the gate structure and overlying the surface of the first layer of the gate structure.

2. The method of claim 1, wherein
   forming the gate structure comprises
      forming two or more first blanket layers overlying the semiconductor substrate wherein the two or more first blanket layers comprise the gate stack;
      forming one or more second blanket layers having a first thickness overlying the two or more first blanket layers, wherein the one or more second blanket layers comprise the sacrificial layer;
      etching the one or more second blanket layers and the two or more first blanket layers to form the gate structure; and
   forming the epitaxial layer comprises forming the epitaxial layer to a second thickness.

3. The method of claim 1, wherein the epitaxial layer is formed following an implantation process to create a source/drain area, and the implantation process is performed following selectively removing the sacrificial layer.

4. The method of claim 1, wherein the epitaxial layer is a doped epitaxial layer.

5. The method of claim 1, wherein the sacrificial layer is selectively etchable relative to an immediately adjacent top portion of the gate stack.

6. The method of claim 1, wherein the sacrificial layer portion is an oxide.

7. The method of claim 1, wherein the sacrificial layer comprises an amorphous carbon.

8. The method of claim 1, wherein the gate stack comprises polysilicon.

9. The method of claim 2, wherein the second thickness of the epitaxial layer is substantially the same as the first thickness.

10. The method of claim 9, wherein the second thickness is less than the first thickness.

11. The method of claim 10, wherein the second thickness is greater than the first thickness.

12. The method of claim 3 wherein the epitaxial layer is an undoped epitaxial layer.

13. The method of claim 4, wherein the epitaxial layer is doped during a source/drain implantation process.

14. The method of claim 6, wherein the oxide comprises an oxide hard mask.

15. The method of claim 14, wherein the oxide comprises tetraethyl orthosilicate (TEOS).

16. The method of claim 15, wherein the sidewalls comprise a nitride.

17. The method of claim 7, wherein the sidewalls comprise an oxide.

18. The method of claim 7, wherein the sidewalls comprise a nitride.

19. The method of claim 18, wherein the sacrificial layer comprises a nitride.

20. The method of claim 18, wherein the sidewall comprises an oxide.

* * * * *

UNITED STATES PATENT AND TRADEMARK OFFICE
CERTIFICATE OF CORRECTION

| | | |
|---|---|---|
| PATENT NO. | : 7,553,732 B1 | Page 1 of 1 |
| APPLICATION NO. | : 11/150923 | |
| DATED | : June 30, 2009 | |
| INVENTOR(S) | : David E. Brown and Scott D. Luning | |

It is certified that error appears in the above-identified patent and that said Letters Patent is hereby corrected as shown below:

At column 13, lines 19-20, change "the surface of the first layer of the gate structure." to -- the surface of the gate structure. --

At column 14, lines 15-16, change "The method of claim 9, wherein the second thickness is less than the first thickness." to -- The method of claim 2, wherein the second thickness of the epitaxial layer is less than the first thickness. --

At column 14, lines 17-18 change "The method of claim 10, wherein the second thickness is greater than the first thickness." to -- The method of claim 2, wherein the second thickness of the epitaxial layer is greater than the first thickness. --

Signed and Sealed this

Eighteenth Day of January, 2011

David J. Kappos
*Director of the United States Patent and Trademark Office*